United States Patent
Smorchkova et al.

(10) Patent No.: US 7,800,132 B2
(45) Date of Patent: Sep. 21, 2010

(54) HIGH ELECTRON MOBILITY TRANSISTOR SEMICONDUCTOR DEVICE HAVING FIELD MITIGATING PLATE AND FABRICATION METHOD THEREOF

(75) Inventors: Ioulia Smorchkova, Lakewood, CA (US); Carol Namba, Walnut, CA (US); Po-Hsin Liu, Anaheim, CA (US); Robert Coffie, Camarillo, CA (US); Roger Tsai, Torrance, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 114 days.

(21) Appl. No.: 11/976,590

(22) Filed: Oct. 25, 2007

(65) Prior Publication Data

US 2009/0108299 A1    Apr. 30, 2009

(51) Int. Cl.
*H01L 29/778* (2006.01)
(52) U.S. Cl. .............. 257/194; 257/192; 257/E29.246; 257/E21.403; 438/172
(58) Field of Classification Search ................. 257/192, 257/194, 193, E29.246, E21.403, 24; 438/172
See application file for complete search history.

(56) References Cited

U.S. PATENT DOCUMENTS

| | | |
|---|---|---|
| 6,777,278 B2 | 8/2004 | Smith |
| 6,852,615 B2 | 2/2005 | Micovic et al. |
| 6,982,204 B2 | 1/2006 | Saxler et al. |
| 7,030,428 B2 | 4/2006 | Saxler |
| 7,045,404 B2 | 5/2006 | Sheppard et al. |
| 7,098,490 B2 | 8/2006 | Micovic et al. |
| 7,102,179 B2 | 9/2006 | Saito et al. |
| 7,161,194 B2 | 1/2007 | Parikh et al. |
| 2002/0137236 A1 | 9/2002 | Schaff et al. |
| 2003/0218183 A1 | 11/2003 | Micovic et al. |
| 2003/0227027 A1 | 12/2003 | Micovic et al. |
| 2005/0051796 A1 | 3/2005 | Parikh et al. |
| 2005/0051800 A1 | 3/2005 | Mishra et al. |
| 2005/0067693 A1 | 3/2005 | Nihei et al. |
| 2005/0253168 A1* | 11/2005 | Wu et al. ................... 257/192 |
| 2005/0263844 A1 | 12/2005 | Saito et al. |
| 2006/0043416 A1 | 3/2006 | P. Li et al. |
| 2006/0214187 A1 | 9/2006 | Mita et al. |
| 2006/0226442 A1 | 10/2006 | Zhang et al. |
| 2006/0255364 A1 | 11/2006 | Saxler et al. |

(Continued)

FOREIGN PATENT DOCUMENTS

WO    WO 2006/110511 A2    10/2006

OTHER PUBLICATIONS

Web document by Wikipedia about Schottky Barrier dated Jul. 14, 2009 ( 3 pages ).*

(Continued)

*Primary Examiner*—Thinh T Nguyen
(74) *Attorney, Agent, or Firm*—Posz Law Group, PLC

(57) ABSTRACT

A semiconductor device includes a T-gate disposed between drain and source regions and above a barrier layer to form a Schottky contact to the channel layer. A first inactive field mitigating plate is disposed above a portion of the T-gate and a second active field plate is disposed above the barrier layer and in a vicinity of the T-gate.

9 Claims, 8 Drawing Sheets

U.S. PATENT DOCUMENTS

| | | |
|---|---|---|
| 2006/0255366 A1 | 11/2006 | Sheppard et al. |
| 2006/0289901 A1 | 12/2006 | Sheppard et al. |
| 2007/0018210 A1 | 1/2007 | Sheppard |
| 2007/0138506 A1 | 6/2007 | Braddock |
| 2007/0164321 A1 | 7/2007 | Sheppard et al. |
| 2007/0164322 A1 | 7/2007 | Smith et al. |
| 2007/0295993 A1 | 12/2007 | Chen et al. |
| 2008/0035934 A1* | 2/2008 | Sheppard et al. ............... 257/76 |
| 2008/0124851 A1 | 5/2008 | Zhang et al. |
| 2009/0230429 A1* | 9/2009 | Miyamoto et al. .......... 257/192 |

OTHER PUBLICATIONS

"Advanced modelling of GaN/AlGaN HEMT devices with field plate," Brannick et al., *Physica Status Solidi*, vol. 4, Issue 2, pp. 651-654 (2007).

Search Report issued from the German Patent Office issued on Jan. 12, 2009 for the corresponding German patent application No. 10 2008 052 595.2.

German Office Action issued from the German Patent Office on Jul. 1, 2010 in the corresponding German patent application No. 10 2008 052 595.2-33.

* cited by examiner

US 7,800,132 B2

HIGH ELECTRON MOBILITY TRANSISTOR SEMICONDUCTOR DEVICE HAVING FIELD MITIGATING PLATE AND FABRICATION METHOD THEREOF

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Government Contract Number N00014-05-C-0121 awarded by the Office of Naval Research, Department of the Navy.

TECHNICAL FIELD

The technical field relates generally to a semiconductor device and a fabrication method therefore, and, more particularly, to a semiconductor device operational at microwave and mm-wave frequencies.

BACKGROUND

Wide band gap semiconductors such as a Group III nitrides offer a number of superior properties that make them very attractive for a number of electronic applications. In particular, high electric field breakdown strengths, high current carrying capabilities and high electron saturation velocities allow nitride-based High Electron Mobility Transistors (HEMTs) to provide very high voltage and high power operation at microwave and mm-wave frequencies.

In order to promote wide scale adoption of this technology, Group III nitride HEMTs must satisfy certain metrics such as a minimum operation time duration before power degradation. One particular aspect that has limited the device lifetime has been the presence of high electric fields in these structures that can lead to increased charge trapping and excessive gate leakage with stress time. These field driven mechanisms can be significant obstacles to achieving device stability.

It would be desirable to have a semiconductor device fabrication process that could minimize high-electric field induced degradation mechanisms and enable the manufacture of HEMT devices suitable for reliable microwave and mm-wave frequency operation. It would be further desirable for such a semiconductor fabrication process to also satisfy the production efficiency and complexity levels of current semiconductor device fabrication processes. It would be further desirable for such a semiconductor fabrication process to have repeatability and robustness in a manufacturing environment.

SUMMARY

Accordingly, a semiconductor device according to various embodiments includes a field plate for minimizing the above described electric fields and improving device reliability without significantly affecting the device performance at mm-wave frequencies.

A method of forming the semiconductor device on a semiconductor substrate including a source region, a drain region, a T-gate and a field mitigating feature according to various embodiments includes: forming a dielectric layer over the T-gate, and a surface area between the T-gate and the source region and between the T-gate and the drain region; forming a resist layer on the dielectric layer; forming a window in the resist layer; depositing a metal film by a directional deposition technique in the window and on the resist layer; and lifting off the resist to form a first field plate disposed above a portion of the T-gate (electrically inactive or floating field plate) and a second field plate (active field plate) disposed on the semiconductor substrate and in a vicinity of the T-gate.

In accordance with the novel method, the field plate geometry can be optimized. Particularly, accurate field plate placement with respect to the gate (within approximately 0.1 micrometers) combined with ultra-small (less than 0.2 micrometers) active field plate dimensions can be achieved. Further, the novel method provides the flexibility of connecting the field plate to either the source or gate electrodes.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Various embodiments of a semiconductor device and a fabrication method thereof will be discussed with reference to the drawings in which like numbers reference like components, and in which a single reference number may be used to identify an exemplary one of multiple like components.

Referring to FIGS. 1A-1J, a semiconductor device fabrication method for forming a semiconductor device having a field mitigating plate (field plate) for reducing the electric field on the surface of a High Electron Mobility Transistor (HEMT) will be discussed.

Figure 1A:
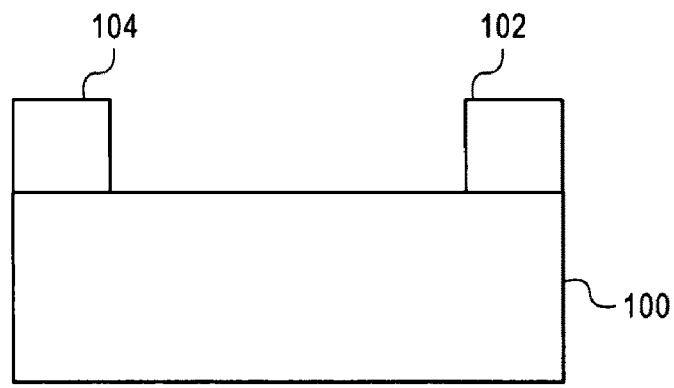
FIGS. 1A-1J are diagrams illustrating a semiconductor device fabrication method according to various embodiments.

Referring to FIG. 1A, a HEMT or Heterostructure Field Effect Transistor (HFET), both of which will be collectively referred to here as HEMT, operable at microwave and mm-wave frequencies is prepared according to conventional techniques. The HEMT includes a semi-insulating substrate such as, for example, a silicon carbide (SiC) substrate, a channel layer and an electron supply or barrier layer which can be comprised of various group III-N semiconductor materials, such as, gallium nitride (GaN), aluminum nitride (AlN), indium nitride (InN), or alloys thereof. The composite barrier layer may also include thin dielectric layers including silicon nitride (SiN), silicon dioxide ($SiO_2$), aluminum oxide ($Al_2O_3$), or other insulating materials. The semi-insulating substrate, channel layer and electron supply layer are all depicted by a single semiconductor substrate 100 for simplicity. As those skilled in the art should appreciate, electrons from the electron supply layer transfer into the channel layer and form a two-dimensional electron gas (2-DEG) channel for carrying current between a source region 104 and a drain region 102. Although not shown, the source region 104 and drain region 102 include low resistive ohmic contacts such as, for example, alloyed layers of titanium, aluminum, nickel and gold.

Figure 1B:
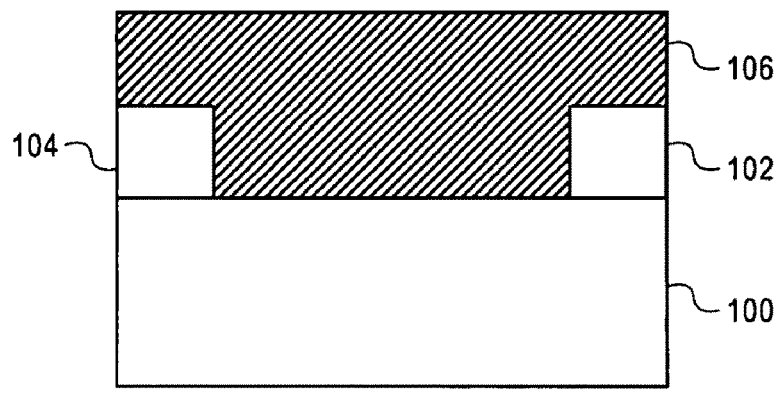

Referring to FIG. 1B, an Electron beam (e-beam) lithography (EBL) resist layer 106 is formed on the semiconductor substrate 100. The EBL resist layer 106 can be, for example, a two-layer resist film composed of polymethylmethacrylate (PMMA) film and a copolymer film formed on the PMMA film. However, the EBL resist layer 106 is not limited to PMMA and copolymer, and may be composed of, for example, other electron beam sensitive resists such as polydimethylglutarimide (PMGI), ZEP 520, ZEP 7000, etc.

The resist layer 106 can be formed on the semiconductor substrate 100 by, for example, depositing the PMMA film and copolymer film successively on the semiconductor substrate 100 while it is spinning at a high speed. However, any resist formation process can be used as long as it results in the semiconductor substrate 100 being evenly coated with the resist layer 106. Subsequently, as those skilled in the art will appreciate, the resist layer 106 can be soft-baked to drive out traces of solvent.

Figure 1C:
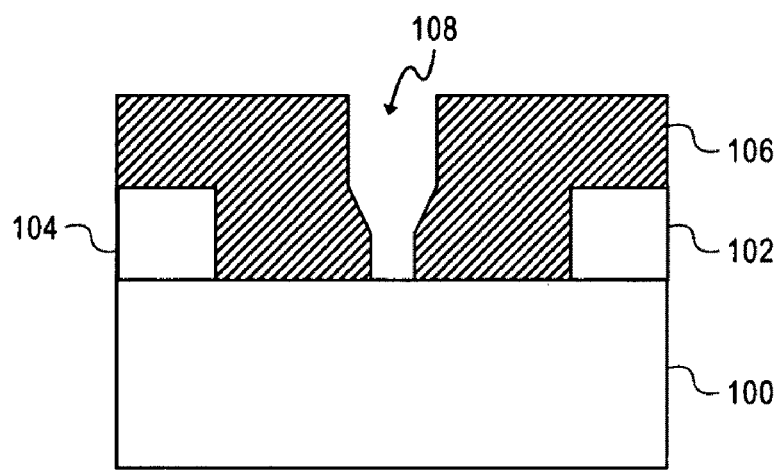

Referring to FIG. 1C, EBL is applied to the resist layer 106 to form a window 108 in the resist layer 106 having a profile in which the width is comparatively narrow in a lower portion and comparatively greater in an upper portion. For example, the e-beam can be applied directly (direct writing) to the resist layer 106 to form the window 108. Alternatively, a self-supporting mask can be used with a flood electron gun source which provides a collimated beam of electrons. The mask can then be imaged directly on the resist layer 106 to thereby form the window 108. Alternatively, optical lithography utilizing bi-layers of various photoresists can be used for the patterning process.

Figure 1D:
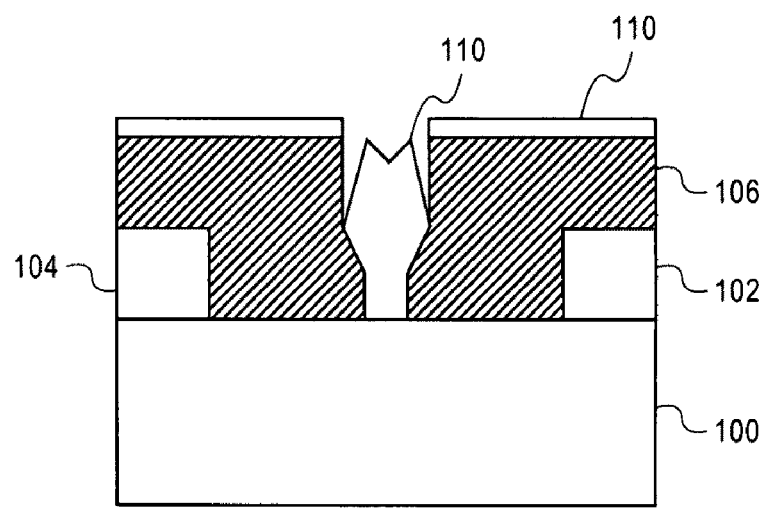

Referring to FIG. 1D, a metal film 110 is deposited on the resist layer 106 and in the window 108 by, for example, an evaporation process in which a metal such as nickel and gold or a combination thereof is heated to the point of vaporization and then evaporated to form the metal film 110.

Prior to metal film deposition, a wet or dry recess etch can be performed into the barrier layer using either wet or dry etching techniques such as, for example, reactive ion etching (RIE) or inductively-coupled plasma (ICP) etching.

Figure 1E:
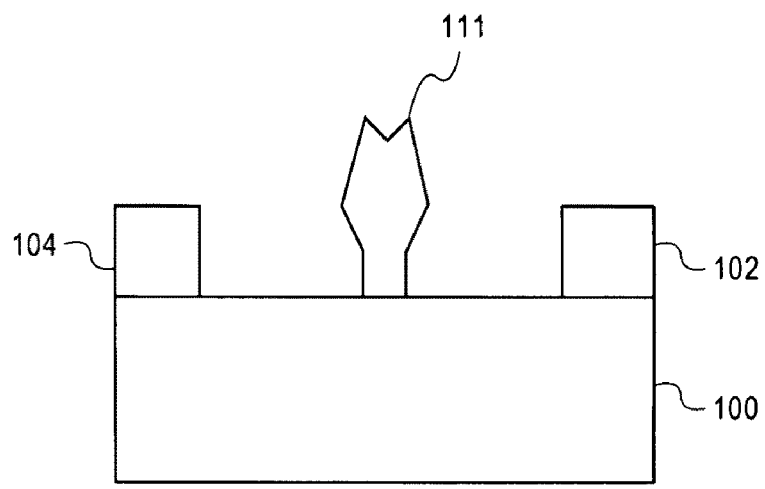

Referring to FIG. 1E, the resist layer 106 is lifted off from the semiconductor substrate 100 to thereby form a metal T-gate 111 which will serve as a Schottky barrier gate for modulating the sheet concentration of accumulated electrons. The resist layer 106 can be lifted off by, for example, application of a liquid stripper or chemical solvent such as, for example, acetone or methylethylketone, or by oxidizing the resist layer 106 in an oxygen plasma system. Evaporation of the metal film 110 and lifting off of the resist layer 106 results in the metal T-gate 111 having a mushroom-like shape with a wide portion referred to as a wing portion on top and a thin portion referred to as a gate stem on the bottom. The metal T-gate 111 can have a gate stem length as small as sub-0.1 micrometers.

Figure 1F:
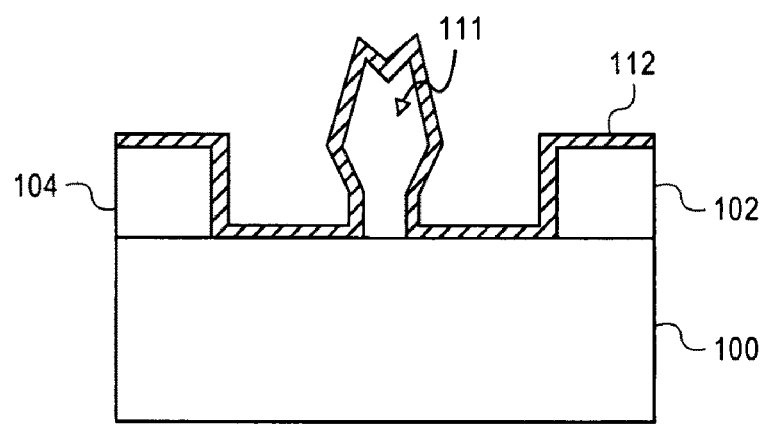

Referring to FIG. 1F, a dielectric material is deposited on the drain and source regions 102, 104, the metal T-gate 111, and surface portions of the substrate 100 between the source region 104 and metal T-gate 111, and between the drain region 102 and metal T-gate 111 to form a dielectric layer 112. The dielectric material can include, for example, silicon nitride (SiN), silicon dioxide ($SiO_2$), or any other material suitable as an insulator highly resistant to electric current. The dielectric material can be deposited by, for example, plasma-enhanced chemical vapor deposition (PECVD) or sputtering deposition.

Figure 1G:
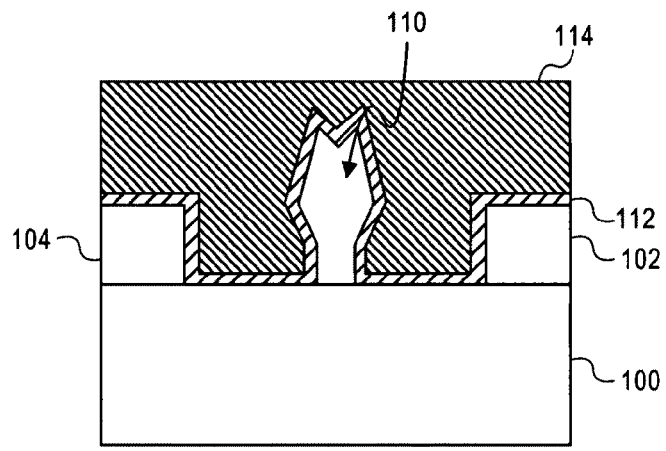
Figure 1H:
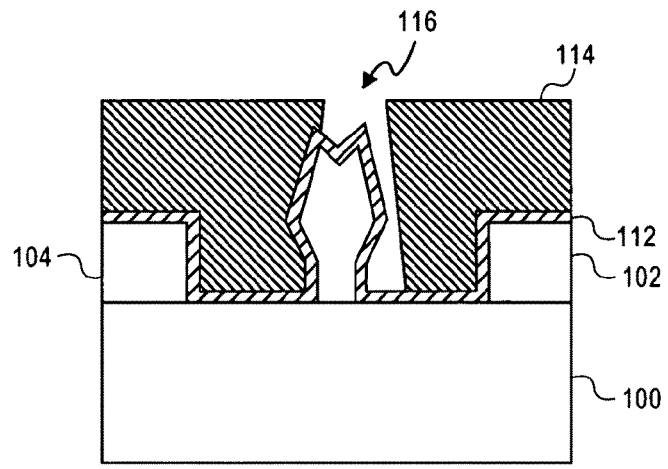

Referring to FIG. 1G, a second resist layer 114 is formed on the dielectric layer 112 similarly to the resist layer 106. Referring to FIG. 1H, a field plate lithography process such as EBL or stepper lithography is performed on the second resist layer 114 to form a window 116 in the resist layer 114. The window 116 is patterned so that a region between the drain region 102 and metal T-gate 111 is opened.

Figure 1I:
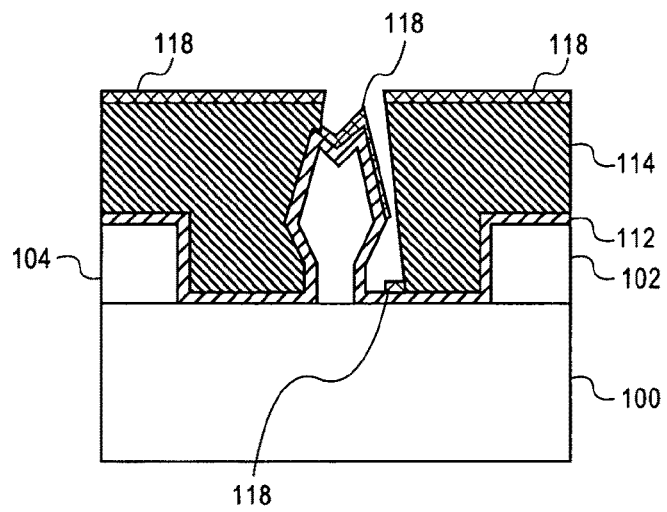

Referring to FIG. 1I, a metal film 118 is deposited on the resist layer 114 and in the window 116 to form first and second field mitigating plates. The metal film 118 is preferably formed by a directional deposition technique such as, for example, e-beam evaporation. A variety of metals such as, for example, titanium (Ti), nickel (Ni), palladium (Pd), platinum (Pt), molybdenum (Mo), tungsten (W), gold (Au) or a combination thereof may be used in this case.

Figure 1J:
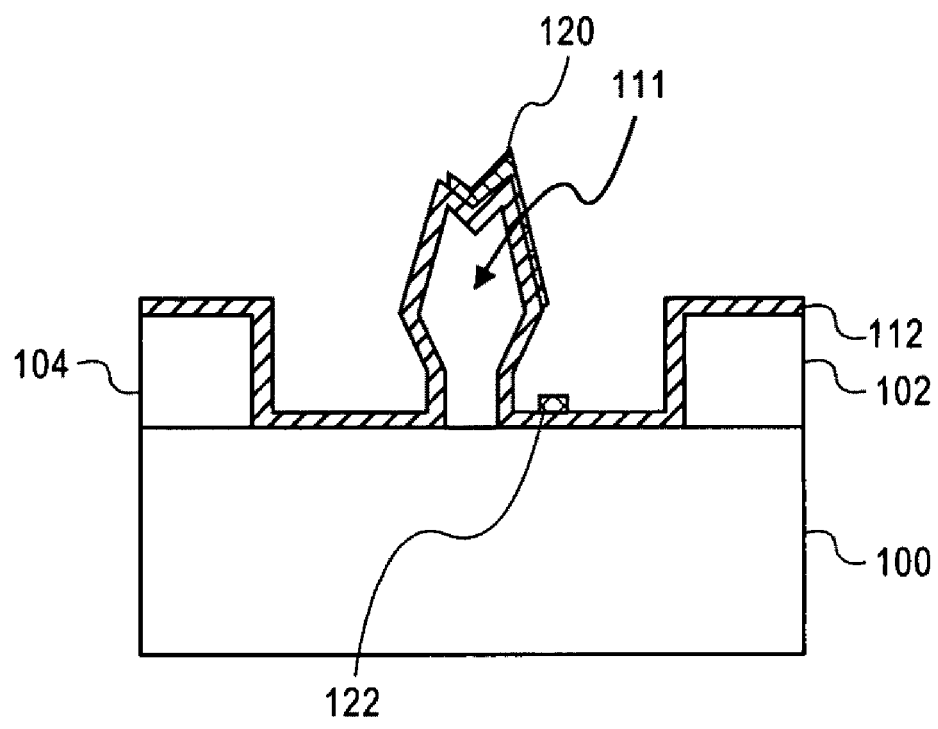

Referring to FIG. 1J, the resist layer 114 is lifted off from the semiconductor substrate 100 to thereby form the first and second field mitigating plates 120, 122. The first and second field mitigating plates 120, 122 can be formed to be discontinuous from each other by using the directional deposition technique and the wing portion of the T-gate 111 as the key breaking point. The first field mitigating plate 120, which is typically the biggest, is electrically inactive. That is, it is not connected to any electrode and simply floats on top of the T-gate 111 to not affect the device performance. In comparison, the second field mitigating plate 122, which is typically the smallest, is connected to either the source region 104 or T-gate 111 through the proper feed design to provide the desired electric field reduction with minimal effect on device performance. As a result of active field plate minimization, parasitic capacitances between the T-gate 111 and source and drain regions 104, 102 (Cgd, Cgs) are significantly reduced to thereby minimize the impact of the field mitigating plate on high-frequency device gain. The distance between the second field mitigating plate 122 and the T-gate 111 is determined by the T-gate wing size which in turn is controlled through the layout dimensions and EBL T-gate exposure dose.

The thickness of the field mitigating plates is limited to values lower than the T-gate stem height to ensure complete and consistent field plate breakage along its length. The field plate lateral dimensions are controlled through device layout and field plate exposure dose. Further, the length of the window 116 formed in the resist layer 114 during field plate lithography can be greater than 0.5 micrometers, while still permitting production of a second field mitigating plate 122 having a lateral length of approximately 0.15 micrometers or less. The large opening allows either e-beam lithography or stepper lithography to be used for the field plate lithography.

Figure 3:
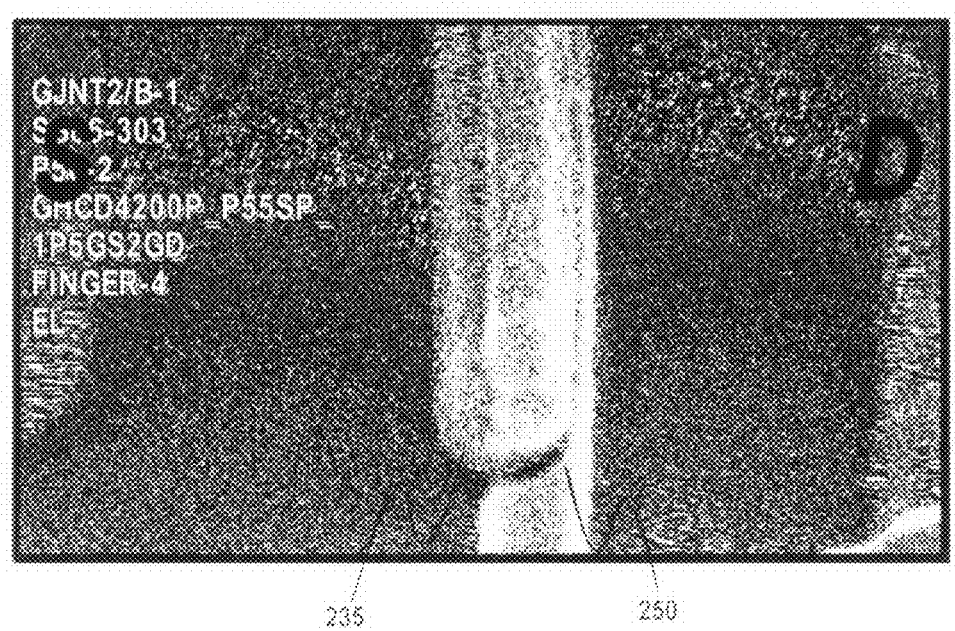
FIG. 3 is a scanning electron micrograph image showing gate and field plate portions of the semiconductor device.

Thereby, the novel semiconductor fabrication method shown in FIGS. 1A-1J can form a field mitigating plate 122 that reduces the electric field at the surface and thereby improves devices reliability. Further, because the length of the field mitigating plate 122 can be as small as approximately 0.15 micrometers, it will not significantly affect the device performance at mm-wave frequencies. As shown in FIG. 3, a scanning electron micrograph (SEM) image of a semiconductor device fabricated according to the above process confirms the presence of the field mitigating plate 250 on the semiconductor substrate in the vicinity of the metal T-gate 235.

Figure 2:
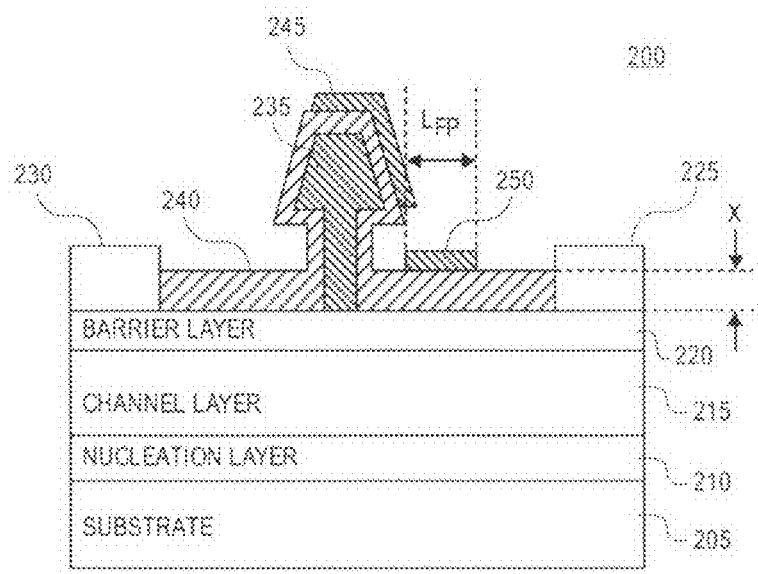
FIG. 2 is a diagram illustrating an exemplary semiconductor device according to a first embodiment.

Referring to FIG. 2, an exemplary semiconductor device 200 in accordance with a first embodiment will be discussed. The semiconductor device 200 includes a semi-insulating substrate 205 which is preferably a silicon carbide (SiC) substrate, a nucleation layer 210, which is preferably composed of aluminum nitrite (AlN), disposed above the semi-insulating substrate 205, a channel or buffer layer 215 disposed above the nucleation layer 210, and a barrier layer 220 disposed above the channel layer 215. The barrier layer 220 induces a 2-DEG channel at an interface between the barrier layer 220 and the channel or buffer layer 215.

The semiconductor device 200 further includes drain and source regions 225, 230 disposed above the barrier layer 220 to form a low resistivity connection through the barrier layer 220 to the 2-DEG channel. A metal T-gate 235 is disposed between the drain and source regions 225, 230 and above the barrier layer 220. A dielectric layer 240 preferably composed of SiN coats a surface portion of the barrier layer 220 between the source region 230 and the T-gate 235, between the drain region 225 and the T-gate 235, and the T-gate 235.

A first field plate 245 is disposed above a portion of the dielectric layer 240 on the T-gate 235 and a second field plate 250 is disposed above the dielectric layer 240 and in a vicinity of the T-gate 235. Further, although not shown, the second field plate 250 can be connected to either the source region 230 or the metal T-gate 235 in the longitudinal direction outside the active device region. A lateral length ($L_{FP}$) of the second field plate 250 can be 0.5 micrometers or less, preferably less than or equal to 0.15 micrometers.

Figure 4B:
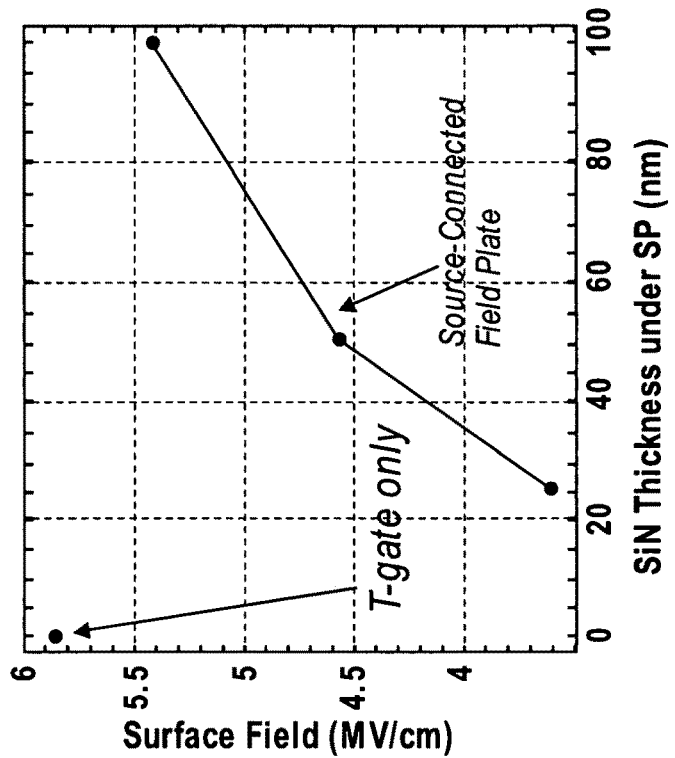
FIG. 4B is a diagram illustrating simulated surface electric field versus thickness of the silicon nitride dielectric layer under a source-connected field plate of the semiconductor device.
Figure 4A:
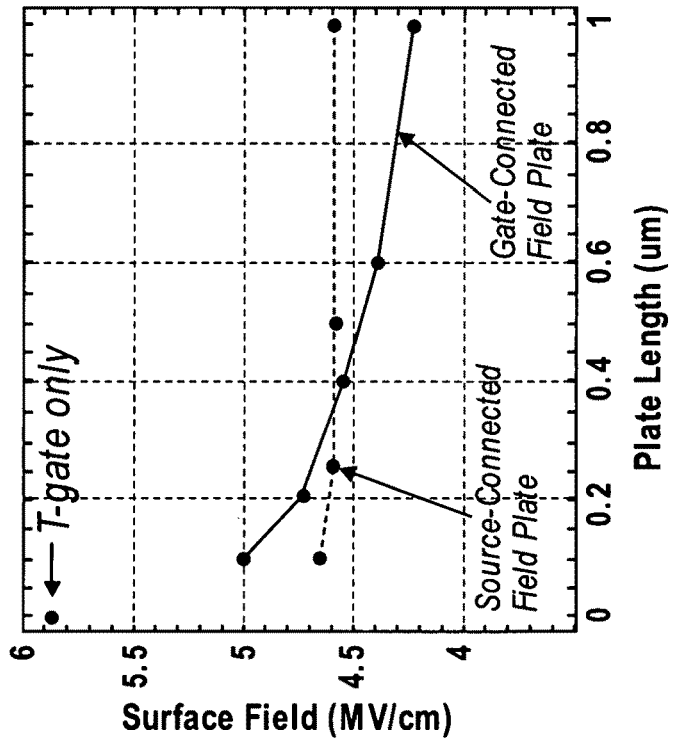
FIG. 4A is a diagram illustrating simulated surface electric fields for various configurations of the semiconductor device as a function of active field plate length.

Referring to FIG. 4A, the sensitivity of the surface field was modeled versus field plate lateral length $L_{FP}$ for: (Source-Connected Field Plate) the semiconductor device 200 in which the second field plate 250 was connected to the source region 230; (Gate-Connected Field Plate) the semiconductor device 200 in which the second field plate 250 is connected to the metal T-gate 235; and (T-gate only) a semiconductor device including the T-gate 235 without first and second field mitigating plates. In all three of the cases the thickness of the dielectric layer 240 was 500 Angstroms. The T-gate only semiconductor device had a surface field of approximately 5.8 MV/cm. In comparison, the source connected field plate and the gate connected field plate semiconductor devices had peak surface fields of approximately 4.6 and 4.8 MV/cm, respectively, when the $L_{FP}$ was equal to 0.15 micrometers. Further, as shown in FIG. 4B, although an increase in the thickness of the SiN of the dielectric layer 240 generally increased the surface field of the source connected field plate semiconductor device, the surface field was still less than the surface field of the T-gate only semiconductor device up to a SiN thickness of 1000 Angstroms.

Figure 5:
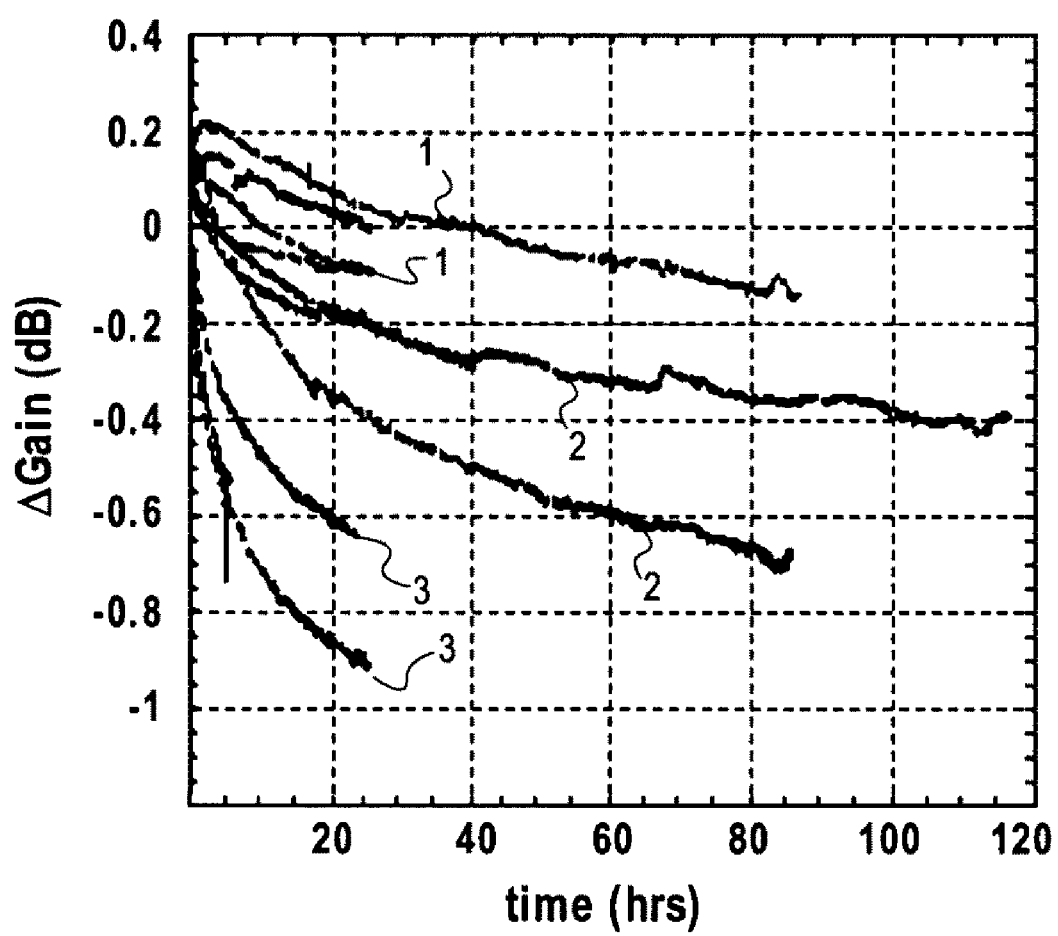
FIG. 5 is a diagram illustrating power gain degradation of the various configurations of the semiconductor device over a radio frequency (RF) stress time.

Referring to FIG. 5, the change in power gain was measured for: (1) the semiconductor device 200 in which the second field plate 250 was connected to the source region 230 and had a lateral length $L_{FP}$ of 0.20; (2) the semiconductor device 200 in which the second field plate 250 was connected to the source region 230 and had a lateral length $L_{FP}$ of 0.15; and (3) a semiconductor device including the T-gate without first and second field mitigating plates. The RF stress conditions for the measurements were: Frequency=40 GHz; Vds=25 V; Ids,q=200 mA/mm; Compression=~2 dB. The device gate periphery for all three cases was 500 micrometers. The best result for the device configuration 3 was a decrease in gain of over 0.6 dB in just 20 hours. In comparison, the best results for the device configurations 1 and 2 were a decrease in gain of only 0.2 dB approximately over the same time period of 20 hours. The advantages achieved by device configurations 1, 2 can be further demonstrated when the time period is extended pass 100 hours.

Figure 6:
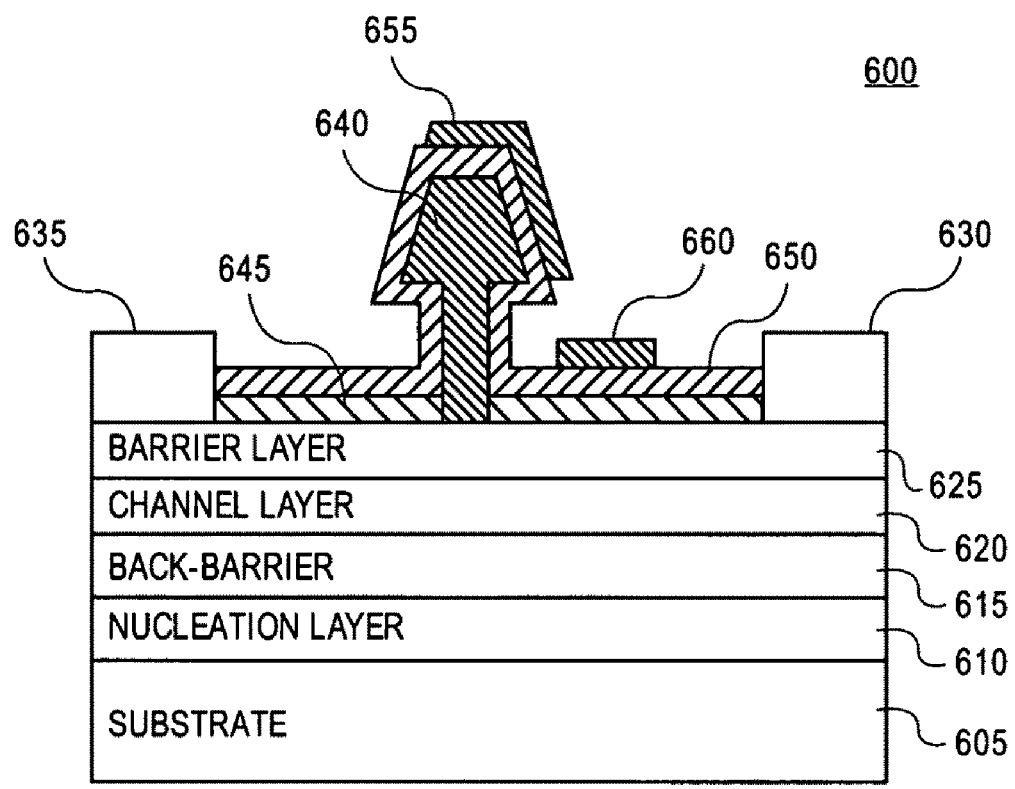
FIG. 6 is a diagram illustrating an exemplary semiconductor device according to a second embodiment.

Referring to FIG. 6, an exemplary semiconductor device 600 in accordance with a second embodiment will be discussed. The semiconductor device 600 includes a semi-insulating substrate 605, which is preferably a SiC substrate, and a nucleation layer 610, which is preferably composed of aluminum nitrite (AlN), disposed above the semi-insulating substrate 605. A back-barrier layer 615, which is preferably composed of aluminum gallium nitrite (AlGaN) can optionally be disposed above the nucleation layer 610. A channel layer 620 is disposed above the back-barrier layer 615, and a barrier layer 625 is disposed above the channel layer 620. A first dielectric layer 645 is disposed above the barrier layer 625. As those skilled in the art should appreciate, the first dielectric layer 645 can be fully or partially etched by wet or dry etching techniques to form openings therein in which drain and source regions 630, 635 can be formed above the barrier layer 625 and a metal T-gate 640 can be formed between the drain and source regions 630, 635. The drain and source regions 630, 635 form a low resistivity connection through the barrier layer 625 to the channel layer 620. The metal T-gate 640 operates to modulate the charge in the channel layer 620. A first dielectric layer 645 preferably composed of silicon nitride (SiN), aluminum nitride (AlN) or a combination thereof coats a surface portion of the barrier layer 620 between the source region 635 and the T-gate 640 and between the drain region 630 and the T-gate 640 and preferably has a thickness between 3 and 25 nanometers.

A second dielectric layer 650 preferably composed of SiN coats the T-gate 640 and the first dielectric layer 645. First and second field plates 655, 660 are disposed on the second dielectric layer 650. The first dielectric layer 645 is preferably formed by Molecular beam epitaxy (MBE), and the second dielectric layer 650 is preferably formed by plasma-enhanced CVD.

The first dielectric layer 645 protects the semiconductor surface from the processing environment, thereby reducing surface damage and minimizing trap formation. The second dielectric layer 650 provides metal gate encapsulation into passivating dielectric material and increases separation between the active field plate 660 and semiconductor surface to a desired value.

The apparatuses and methods discussed above and the inventive principles thereof are intended to and will manufacture a semiconductor device having a field mitigating plate for minimizing electric fields with minimal power gain loss, thereby increasing the device breakdown voltage, minimizing charge trapping, and reducing gate leakage current. The field-mitigating plate can be as small as 0.1 micrometers and still provide the reduced electric field benefit.

It is expected that one of ordinary skill given the above described principles, concepts and examples will be able to implement other alternative procedures and constructions that offer the same benefits. For example, the field mitigating plate could be formed prior to formation of the T-gate. The T-gate can be formed afterwards using a number of isotropic dry etches. It is anticipated that the claims below cover many such other examples.

The invention claimed is:

1. A semiconductor device comprising:
   a semi-insulating substrate;
   a channel layer disposed above the semi-insulating substrate;
   a barrier layer disposed over the channel layer, the barrier layer inducing a 2-DEG layer at an interface between the barrier layer and the channel layer;

source and drain regions disposed above the barrier layer to form a low resistivity connection through the barrier layer to the 2-DEG layer;

a T-gate disposed between the source and drain regions and above the barrier layer;

a first field plate disposed above a portion of the T-gate;

a second field plate disposed above the barrier layer and in a vicinity of the T-gate; and a dielectric layer coating a portion of the barrier layer between the source region and the T-gate and between the drain region and the T-gate, and the T-gate, wherein the first and second field plates are disposed on the dielectric layer.

2. The semiconductor device of claim 1, wherein the second field plate is connected to one of the source region and the T-gate.

3. The semiconductor device of claim 1, wherein the dielectric layer comprises silicon nitride (SiN).

4. The semiconductor device of claim 1, wherein a lateral length of the second field plate is between 0.15 and 0.20 micrometers.

5. The semiconductor device of claim 1, wherein a lateral length of the second field plate is less than or equal to 0.15 micrometers.

6. The semiconductor device of claim 1,
wherein the T-gate layer includes a relatively wide wing portion on top and a relatively thin gate stem portion on bottom,
wherein the first field plate disposed above the wing portion of the T-gate, and
wherein the gate stem portion is formed above the entire barrier layer.

7. The semiconductor device of claim 6,
wherein a first thickness of the first field plate is less than a height of the gate stem portion of the T-gate, and
wherein a second thickness of the second field plate is less than the height of the gate stem portion of the T-gate.

8. The semiconductor device of claim 1,
wherein the first field plate is larger than the second field plate.

9. The semiconductor device of claim 1,
wherein the second field plate is connected to either the source region or the T-gate.

* * * * *